US006747228B2

(12) United States Patent  
Capser

(10) Patent No.: US 6,747,228 B2
(45) Date of Patent: *Jun. 8, 2004

(54) ENHANCED GRADING AND SORTING OF SEMICONDUCTOR DEVICES USING MODULAR "PLUG-IN" SORT ALGORITHMS

(75) Inventor: Lance M. Capser, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/054,430

(22) Filed: Jan. 22, 2002

(65) Prior Publication Data

US 2002/0063085 A1 May 30, 2002

Related U.S. Application Data

(63) Continuation of application No. 09/298,156, filed on Apr. 23, 1999.
(60) Provisional application No. 60/126,790, filed on Mar. 30, 1999.

(51) Int. Cl.[7] .............................................. B07C 5/344
(52) U.S. Cl. ........................................ 209/571; 209/573
(58) Field of Search ................................ 209/571, 573; 324/759, 765, 158.1

(56) References Cited

U.S. PATENT DOCUMENTS

| 2,902,152 | A |   | 9/1959  | Wilkes          |         |
|-----------|---|---|---------|-----------------|---------|
| 3,716,786 | A |   | 2/1973  | Gearin          |         |
| 3,980,553 | A |   | 9/1976  | Quinn           |         |
| 4,168,004 | A |   | 9/1979  | Owen            |         |
| 4,388,994 | A |   | 6/1983  | Suda et al.     |         |
| 4,478,352 | A |   | 10/1984 | Amundson et al. |         |
| 4,588,092 | A |   | 5/1986  | Moechnig et al. |         |
| 4,694,964 | A |   | 9/1987  | Ueberreiter     |         |
| 4,826,019 | A |   | 5/1989  | Kondo et al.    |         |
| 4,836,916 | A |   | 6/1989  | Kondo et al.    |         |
| 4,871,963 | A |   | 10/1989 | Cozzi           |         |
| 5,465,850 | A |   | 11/1995 | Kase            |         |
| 5,470,427 | A |   | 11/1995 | Mikel et al.    |         |
| 5,538,141 | A |   | 7/1996  | Gross, Jr. et al. |       |
| 5,568,870 | A |   | 10/1996 | Utech           |         |
| 5,584,395 | A |   | 12/1996 | Homma           |         |
| 5,603,412 | A |   | 2/1997  | Gross, Jr. et al. |       |
| 5,794,789 | A |   | 8/1998  | Payson et al.   |         |
| 5,895,443 | A |   | 4/1999  | Gross, Jr. et al. |       |
| 5,927,512 | A | * | 7/1999  | Beffa           | 209/573 |
| 5,996,996 | A |   | 12/1999 | Brunelle        |         |
| 5,998,751 | A |   | 12/1999 | Brunelle        |         |
| 6,055,463 | A |   | 4/2000  | Cheong et al.   |         |
| 6,066,822 | A |   | 5/2000  | Nemoto et al.   | 209/573 |
| 6,078,188 | A |   | 6/2000  | Bannai et al.   |         |
| 6,125,336 | A |   | 9/2000  | Brunelle        |         |
| 6,223,098 | B1|   | 4/2001  | Cheong et al.   | 700/223 |

* cited by examiner

Primary Examiner—Donald P. Walsh
Assistant Examiner—Joseph Rodriguez
(74) Attorney, Agent, or Firm—TraskBritt

(57) ABSTRACT

A semiconductor device sorting method and apparatus involve development of small, self-contained and focused "qualification" or "sort" algorithm test programs or "modules", each of which modules may test for the validity of a particular, selected grade of a memory or other semiconductor device based on the results of a test pattern associated with, or exhibited by, a particular device under test. Separating the test code from the main flow file of the test program into the aforementioned "plug-in" qualification or sort modules permits the test code to be much simpler and facilitates better organization, as each qualification or sort module may be independent of any other qualification or sort module and only determines in response to its associated test pattern whether or not (TRUE or FALSE) a device qualifies in a given device grade.

6 Claims, 2 Drawing Sheets

ENHANCED GRADING AND SORTING OF SEMICONDUCTOR DEVICES USING MODULAR "PLUG-IN" SORT ALGORITHMS

CROSS-REFERENCE TO RELATED APPLICATIONS

This application is a continuation of application Ser. No. 09/298,156, filed Apr. 23, 1999, now U.S. Pat. No. 6,563,070, issued May 13, 2003, which claims the benefit of U.S. Provisional Application Serial No. 60/126,790, filed Mar. 30, 1999.

BACKGROUND OF THE INVENTION

1. Field of the Invention

The present invention is related to the grading and sorting of semiconductor devices and, more specifically, singulated memory devices, using modular "plug-in" sort algorithms during an automated device sort process.

2. State of the Art

It is conventional to characterize or qualify singulated semiconductor devices, including memory devices, for compliance with certain criteria in order to determine their suitability or lack thereof for different potential uses. In the past, several different test programs have been used to sort all of the potential grades of memory product such as, for example, All good (Full Array or Profit), DQ/Array partials, Slow (GD) memory, and Audio RAM. Because of the complexity involved in testing each of the memory product types, separate programs have been developed to sort the full array/partials vs. various forms of Audio RAM. This test sequence involves running product (a memory device) through multiple steps: as a device fails to sort to a particular grade in one test program, it is subsequently, sequentially loaded in one or more other test programs and eventually sorted out to a particular grade, or failed. Using multiple test programs in this way leads to increased test times, excessive part handling, and lost or mis-binned parts due to the over-complexity of the test flow process. Furthermore, maintaining multiple programs for a particular type of memory product also increases work load as well as resource strain on engineering personnel and the systems they are responsible for maintaining and operating.

BRIEF SUMMARY OF THE INVENTION

The device sorting method and apparatus of the present invention solves the aforementioned problems of sorting memory devices into multiple memory grades by eliminating a requirement for multiple passes by the devices through different test programs, unlike the process flow in conventional sorting methods. The inventive method and apparatus also allow for simple modification of precedence rules when business objectives change and it is consequently determined that one particular grade is more valuable or cost-effective than another, previously favored, grade. Furthermore, creating engineering "bins" for screening parts or collecting samples exhibiting certain characteristics is easily facilitated with this flexible binning method.

The sorting method and apparatus of the present invention involve development of small, self-contained and focused "qualification" or "sort" algorithm test programs or "modules", each of which modules may test for the validity of a particular, selected grade of a semiconductor memory device based on the results of a test pattern associated with, or exhibited by, a particular device under test. Separating the test code from the main flow file of the test program into the aforementioned "plug-in" qualification or sort modules permits the test code to be much simpler and facilitates better organization, as each qualification or sort module may be independent of any other qualification or sort module and only determines in response to its associated test pattern whether or not (TRUE or FALSE) a device qualifies in a given memory grade. In addition, the modular approach facilitates modification or refinement of test criteria for a given grade, or development of a new device grade, since only the code for a given modular program must be revised or developed, rather than modifying the main program and flow file.

The potential device grades allowed for a given lot of devices to be tested may be determined at the run time for that lot and loaded into the test controller as part of the test flow file. The order in which the memory grades will be selected, or grade precedence, may also be determined at this point. When tests are included in the test flow which pertain to only a subset of the total grades, these tests may be flagged as "constrained" and will, as a result, only register as "fails" if the device initiating the fail response under test is targeted for one of the applicable (subset) grades. Further, the particular fail bin (the bin where a device is to go if it fails to meet the requirements of all available, i.e., usable, grades) is determined in the test flow file so that any given test or subgroup of tests can be screened or sorted to a unique bin for engineering data and sample collection.

The present invention may be implemented through the use of a commercially available semiconductor device tester under control of a suitably programmed workstation or other controller.

As used herein, the term "memory" or "memory device" includes, by way of example only, dynamic random access memories (DRAMs), static random access memories (SRAMs), erasable programmable read-only memories (EPROMs) however programmable and erasable, and flash memory.

As noted below, the method of the present invention, while described herein in relationship to testing of memory devices, is applicable to testing of other types of semiconductor devices.

DESCRIPTION OF THE PREFERRED EMBODIMENT

As noted above, the plug-in sorting method and apparatus of the present invention involve development of small, focused qualification or sort algorithm test programs or modules as discrete program entities separate and apart from, but linked to, the main test program and initiable by the flow file. Each module is configured to test for the validity of a particular, selected device grade based on the results of a test pattern associated with, or exhibited by, a particular device under test in response to test routines run by the tester, as known in the art.

In the preferred embodiment, the potential device grades allowed for a given lot of devices to be tested are determined at the run time for that lot and plug-in sort modules corresponding to those grades are loaded into the test controller as part of the test flow file. Such grades may include, for example, All good (Full Array or Profit), DQ/Array partials, Slow (GD) memory, and Audio RAM. The order in which the memory grades will be selected, or grade precedence for the test process sequence, is also determined at this point. When tests are included in the test flow which pertain to only a subset of the total grades, these tests are flagged as "constrained" so as to only register as "fails" if the device initiating the fail response under test is targeted for one of the applicable (subset) grades. Further, the particular fail bin (the bin where a device is to go if it fails to meet the requirements of all available, i.e., usable, grades) is determined in the test flow file so that any given test or subgroup of tests can be screened or sorted to a unique bin for engineering data and sample collection.

It should be noted at this point that the method and apparatus of the present invention preferably provides for only downgrading of devices as the test sequence continues, so as to avoid confusion and inadvertent upgrading of devices to a higher grade after failing a test associated with the requirements of that grade.

Figure 1:
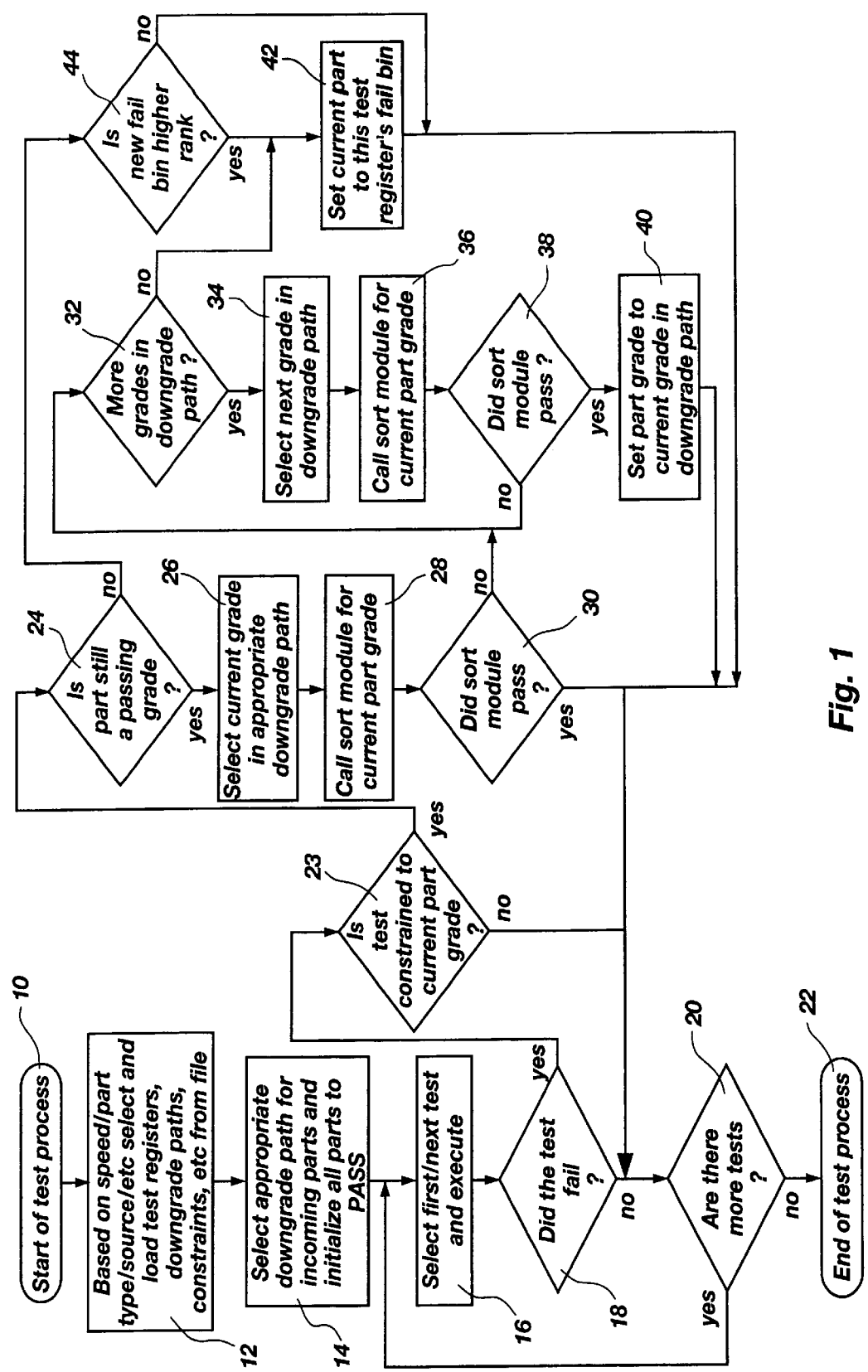
FIG. 1 of the drawings is a flow chart of an exemplary semiconductor device test sequence according to the present invention.

Referring to FIG. 1 of the drawings, a preferred embodiment of the test process, including use of the inventive plug-in sort algorithm modules of the invention, includes the operations as hereinafter described.

At the start of the test process 10, as the test flow file is loaded, the relevant grades for this test lot of memory devices are determined, for example, based on speed, part type, and source, as well as other criteria well known in the art. Appropriate test registers are then selected from a list, and the test registers, downgrade paths and constraints are downloaded as denoted at 12. Each test register is associated with a given fail bin.

Downgrade paths appropriate for the devices in the test lot in question are selected, and all devices in the test lot are arbitrarily initialized to a PASS status. Each device grade is stored in test controller memory, as shown at 14. The "PASS" assumption may not necessarily mean full array or profit, as DQ/partial arrays or audio RAM found early in the test flow must still be tested through all test flow steps. The current (i.e., at this point in the test process) grade of each device under test is then determined as noted below and the appropriate downgrade path for each is selected from those defined in the test flow file.

A first test (or next test, as this sequence continues until all required tests are completed) is selected and executed as at 16 and, with respect to each device, the test sequence may be as is further described in FIG. 1. First, as at 18, a query is made as to whether the device in question fails the selected test. If a determination results in a "no" (i.e., the device passed the test), the next query 20 is to whether there are any more tests. If "yes," the next test is selected as at 16, executed, and the pass/fail query and determination made again. If "no," the test process ends as at 22.

If the device under test fails the first/next test, the "yes" (fail) response to query 18 initiates the query at 23 as to whether failure of the selected test is constrained to the current grade of the device, i.e., whether passing the test is a condition precedent to the device maintaining its sort at the current grade (i.e., the grade assigned before the first/next test is executed). The reason for this query is that failure of one or more selected tests has been determined to be immaterial as to whether the device qualifies (sorts) to that grade. If the answer to query 23 is "no," so that failure of the selected test does not warrant a downgrading of the device, then the test path reverts to query 20 as to whether there are any more tests. If the answer to the query is "yes," and failure of the selected test initiates a downgrade, the next query occurs at 24 as to whether the device is still a passing grade. If the determination is "yes," the current grade in the appropriate downgrade path in light of the device's failure of the test in question is selected at 26, the appropriate sort module is called at 28 for the current grade, and a query is made at 30 as to whether the sort module registers a PASS for that grade. If "yes," the sequence reverts to query 20 as to whether there are further tests. If "no," a query is made at 32 as to whether there are more grades in the downgrade path. If "yes," the next grade in the downgrade path is selected at 34, the appropriate sort module is called at 36 for the then-current grade in the downgrade path, and the query is made at 38 as to whether the sort module registers a PASS for the device in that grade. If the device (fails a "no" response to query 38), the test loop reverts to query 32 as to whether there are more grades in the downgrade path, and sorting along the downgrade path continues. If the sort module registers a PASS (a "yes" response to query 38), the grade for the device is set at 40 to the current grade for which the sort module registered a PASS, and the test loop reverts to query 20 as to whether there are any remaining tests.

If query 32 results in the determination that there are no further grades in the downgrade path (i.e., a "no" response), the device is then categorized or set at 42 to that particular test register's fail bin and the test loop reverts to query 20 as to whether there are any more tests.

If query 24 results in a "no" determination as to whether the device is still a passing grade even after failing a first/next test, this initiates a query 44 as to whether the new fail bin responsive to failure of the test in question is a higher rank (i.e., lower quality) than the fail bin associated with the device's previous status prior to that point in the test process. If "yes," the device is then categorized or set at 42 to that particular test register's fail bin. If "no," the test loop reverts to query 20 as to whether there are any more tests.

It should be noted that, when a device in the lot under test fails a particular test, the sort algorithm finds the current grade of that device in the selected downgrade path. This grade will be the top of the downgrade path if the device in question has never before failed that particular test. Further, the sort algorithm checks to see if the test failed by the device in question is constrained to a particular grade or grades and ignores the failure if the current part grade does not match the constraints placed on the test which was failed. If the test does apply, i.e., the current part grade matches the constraints placed on the test which was failed, the sort algorithm calls (as at 28) the plug-in sort module for the current grade. The sort module then determines whether or not the device still meets the criteria for its grade and returns the appropriate status (TRUE or FALSE).

If the device passes the current grade check, then the fail indication is skipped (ignored) and the device continues to test. However, if the device fails the check by the sort module at 30, then the next grade (if any, per query 32) in the selected downgrade path is selected at 34 and the device is checked with the next grade's associated plug-in sort module at 36, 38. This sequence continues along a downgrade path using the plug-in sort module for each grade in the path until a grade is found for which the device in question meets the criteria as dictated by the associated sort module, the new grade then being assigned to the device. Stated another way, the device continues on a downgrade path until the sort module associated with a particular grade determines that failure of the selected test in question does not disqualify the device for the grade with which that sort module is associated. The next time through the sort algorithm, the device will start sorting at the most recently assigned grade instead of starting at the top. This protocol prevents any possibility of upgrading a device to a grade for which it has previously been tested and failed.

If the device in question meets none of the available grades in the selected downgrade path, then it is sent to a particular fail bin specified in the test flow file. When a part that has already been failed to one of the fail bins fails again, the lowest precedence fail bin (that with the highest number in the fail bin sequence) will be selected. "Plug-in" sorting according to the present invention allows a test program to be easily configured to sort devices under test to different grades of memory and to assign different levels of precedence to each grade without modifying, compiling, and releasing any source code. Additionally, using plug-in sort modules, each associated with a selected grade of interest, provides a readily implementable technique for sorting devices to an arbitrary number of bins, or grades, in a single test pass, thus simplifying test flows and improving test times. Further, the invention also facilitates modifying or augmenting criteria for a given grade based on experience and accordingly modifying the associated sort module, as well as implementing new grades as desired or required by market conditions. Finally, the sorting method of the invention may be used by engineering personnel to easily separate or screen devices which uniquely fail a specific test or group of tests as distinguished from other failures for use in subsequent analysis and experiments.

Figure 2:
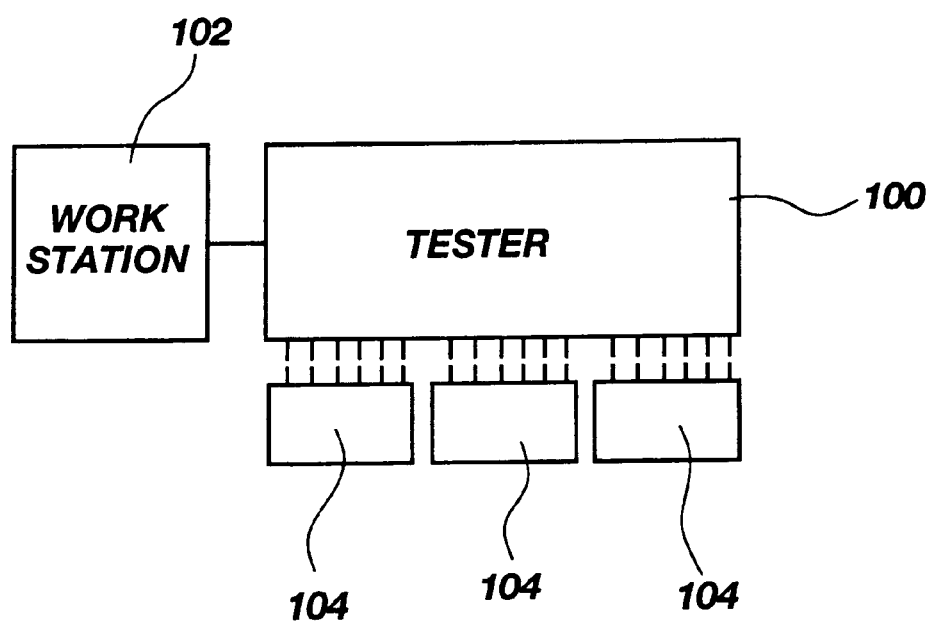
FIG. 2 is a schematic of a tester programmed according to the present invention testing a semiconductor device.

The preferred embodiment of the apparatus of the invention is preferably implemented in either a Teradyne 994-or 996-series High Speed Memory Tester under control of a Sparc 20 workstation, using Sun OS 4.1 or Solaris 2.0 operating software. FIG. 2 depicts tester 100 under control of programmed workstation or other test controller 102 conducting a test process according to the present invention on a plurality of memory devices 104. It should be noted that the hardware required for the test method and apparatus according to the invention is conventional, well-known in the relevant art, and commercially available. Accordingly, no further description thereof is required.

While the present invention has been described in terms of a particular embodiment, those of ordinary skill in the art will understand and appreciate that it is not so limited. Additions, deletions and modifications to the invention as disclosed herein may be effected without departing from the scope of the invention as exemplified by the claims. Moreover, while the invention has been described with reference to memory devices as exemplifying what is currently believed by the inventor to be the best mode of practicing the invention and enabling teaching thereof, it is contemplated that the invention is applicable to the testing of other types of semiconductor devices, such as, by way of example only, microprocessors (including, specifically, digital signal processors) and logic circuits.

What is claimed is:

1. A method of qualifying and sorting semiconductor devices, comprising:
   grouping a plurality of semiconductor devices into a test lot;
   selecting a plurality of device grades and a downgrade path for each selected device grade;
   selecting a test sequence including a plurality of tests, each test corresponding to at least one device grade of the plurality of device grades;
   defining an initial selected device grade as a current device grade of the plurality of device grades for the test lot;
   sorting each semiconductor device in the test lot to a final device grade of the plurality of device grades, the sorting comprising:
     executing at least one test of the test sequence corresponding to the current device grade of each of the plurality of semiconductor devices; and
     after each test executed, sequentially sorting each semiconductor device through the plurality of selected device grades along a selected downgrade path and assigning another device grade as the current device grade and reexecuting at least another test until the current device grade is the final device grade or the semiconductor device fails each of the plurality of device grades; and
   separating the plurality of semiconductor devices from the test lot according to the final device grade of each semiconductor device.

2. The method of claim 1, further comprising sequentially sorting only those semiconductor devices through the plurality of selected device grades that fail a test which is not constrained to the device grade corresponding to the failed test.

3. A method of qualifying and sorting semiconductor devices, comprising:
   selecting a plurality of device grades and a downgrade path for each selected device grade;
   selecting a first test to be performed on at least one semiconductor device;
   executing the first test on the at least one semiconductor device to cause the at least one semiconductor device to exhibit a test pattern responsive thereto; and
   sequentially sorting the at least one semiconductor device through at least two of the plurality of selected device grades along at least one downgrade path responsive to the exhibited test pattern by sequentially comparing the exhibited test pattern to a discrete set of criteria relating to the first test for each of the at least two selected device grades and assigning another device grade and reexecuting a second test until one of the plurality of selected device grades is a final device grade or the semiconductor device fails each of the plurality of selected device grades.

4. A method of qualifying and sorting semiconductor devices, comprising:
   selecting a plurality of device grades and a downgrade path for each selected device grade; and
   sequentially sorting at least one semiconductor device through the plurality of selected device grades along a selected downgrade path solely according to a result of a first test pattern exhibited by the at least one semiconductor device responsive to a first test associated with a first test register selected by a test program and assigning another one of the plurality of device grades and reexecuting a second test until one of the plurality of selected device grades is a final device grade or the at least one semiconductor device fails each of the plurality of selected device grades.

5. The method of claim 4, further comprising:
   sequentially sorting the at least one semiconductor device through the plurality of selected device grades along the selected downgrade path solely according to a result of a second test pattern exhibited by the at least one semiconductor device responsive to a second, different test associated with a second test register selected by the test program.

6. A method of qualifying and sorting a semiconductor device, comprising:

defining a plurality of device grades, a downgrade path between the plurality of device grades and an initial device trade as a current device grade of the semiconductor device from among the plurality of device grades;

testing the semiconductor device with at least one test from a plurality of tests corresponding to the current device grade; and when the semiconductor device fails the at least one test, retesting the semiconductor device at the current device grade reassigned from another one of the plurality of device grades along the downgrade path until either the semiconductor device remains at a final device grade from among the plurality of device grades or the semiconductor device fails all of the plurality of device grades.

* * * * *